US009194568B2

(12) United States Patent
Moriyama et al.

(10) Patent No.: US 9,194,568 B2
(45) Date of Patent: Nov. 24, 2015

(54) LIGHTING UNIT AND LIGHTING DEVICE

(75) Inventors: Takayoshi Moriyama, Kanagawa (JP); Junya Murata, Kanagawa (JP); Makoto Yamazaki, Kanagawa (JP); Yumi Hanyuda, Kanagawa (JP); Katsumi Hisano, Chiba (JP); Mitsuaki Kato, Kanagawa (JP); Masataka Shiratsuchi, Kanagawa (JP); Yuichiro Yamamoto, Kanagawa (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 13/567,872

(22) Filed: Aug. 6, 2012

(65) Prior Publication Data

US 2013/0250577 A1 Sep. 26, 2013

(30) Foreign Application Priority Data

Mar. 26, 2012 (JP) ................................ 2012-070005

(51) Int. Cl.

*F21V 29/00* (2015.01)
*H05K 3/00* (2006.01)
*F21V 21/38* (2006.01)

(Continued)

(52) U.S. Cl.

CPC . *F21V 21/38* (2013.01); *F21S 2/00* (2013.01); *F21V 21/30* (2013.01); *F21V 29/763* (2015.01); *F21V 15/01* (2013.01); *F21Y 2101/02* (2013.01); *F21Y 2105/001* (2013.01); *Y10T 29/49124* (2015.01)

(58) Field of Classification Search

CPC ............ F21S 2/00; F21V 15/01; F21V 21/30; F21V 21/38; F21V 29/763; F21Y 2101/02; F21Y 2105/001; Y10T 29/49124

USPC .................. 362/218, 249.01, 249.02, 249.03, 362/249.06, 294, 382, 373

See application file for complete search history.

(56) References Cited

U.S. PATENT DOCUMENTS

| | | | | |
|---|---|---|---|---|
| 7,338,186 | B1 | 3/2008 | Wu et al. | |
| 2005/0169015 | A1* | 8/2005 | Luk et al. | 362/648 |

(Continued)

FOREIGN PATENT DOCUMENTS

| | | | |
|---|---|---|---|
| CN | 102221146 | A | 10/2011 |
| DE | 20 2008 016 231.9 | | 5/2009 |

(Continued)

OTHER PUBLICATIONS

European Search Report Patent Application No. 12178452.4 dated Jun. 21, 2013.

(Continued)

*Primary Examiner* — Stephen F Husar
(74) *Attorney, Agent, or Firm* — Patterson & Sheridan, LLP

(57) ABSTRACT

A lighting unit according to one embodiment includes a board, a support member, and a plurality of heat radiation fins. A light emitting element is disposed on a first surface of the board. The support member has an interior surface on which a second surface of the board that is opposite to the first surface is disposed to be in contact therewith to enable heat conduction from the board to the support member. The heat radiation fins are disposed on an exterior surface of the support member substantially parallel with each other and with a clearance between each other, and each having a flat shape that extends outwardly from the exterior surface.

13 Claims, 19 Drawing Sheets

(51) Int. Cl.

| | |
|---|---|
| ***F21S 2/00*** | (2006.01) |
| ***F21V 21/30*** | (2006.01) |
| ***F21V 29/76*** | (2015.01) |
| *F21V 15/01* | (2006.01) |
| *F21Y 101/02* | (2006.01) |
| *F21Y 105/00* | (2006.01) |

(56) References Cited

U.S. PATENT DOCUMENTS

2007/0070628 A1 3/2007 Chen
2009/0180281 A1* 7/2009 Ahland et al. ................ 362/234
2010/0110679 A1 5/2010 Teng et al.
2010/0118534 A1 5/2010 Lo
2010/0157570 A1 6/2010 Xiao et al.
2012/0012284 A1* 1/2012 Salamon .................... 165/109.1
2012/0051062 A1 3/2012 Miridonov et al.
2013/0088861 A1 4/2013 Wu

FOREIGN PATENT DOCUMENTS

EP 2-187-121 A1 5/2010
EP 2-251-594 A1 11/2010
GB 2 479 142 A 10/2011
JP 2007-134316 5/2007
WO 2007046121 A1 4/2007
WO 2011085529 A1 7/2011
WO 2011099633 A1 8/2011
WO 2011-153761 A1 12/2011

OTHER PUBLICATIONS

Extended European Search Report; EP 12178452.4 dated Oct. 14, 2013.

* cited by examiner

LIGHTING UNIT AND LIGHTING DEVICE

CROSS-REFERENCE TO RELATED APPLICATION

This application is based upon and claims priority from prior Japanese Patent Application No. 2012-070005, filed on Mar. 26, 2012, the entire contents of which are incorporated herein by reference.

FIELD

Embodiments described herein relate generally to a lighting unit and a lighting device.

BACKGROUND

Currently, a lighting device which includes a light source provided with semiconductor lighting elements such as LEDs (light emitting diodes) comes in practical use. A type of this lighting device has a reflector which controls distribution of light emitted from the light source, and heat radiation fins which stand on the outer wall of the reflector to dissipate heat generated from the light source to the outside, for example. According to this type of lighting equipment, however, the heat dissipation effect of the heat radiation fins were not necessarily high.

An object to be achieved by the embodiments is to provide a lighting unit and a lighting device capable of improving the heat dissipation effect.

DETAILED DESCRIPTION

Figure 1:
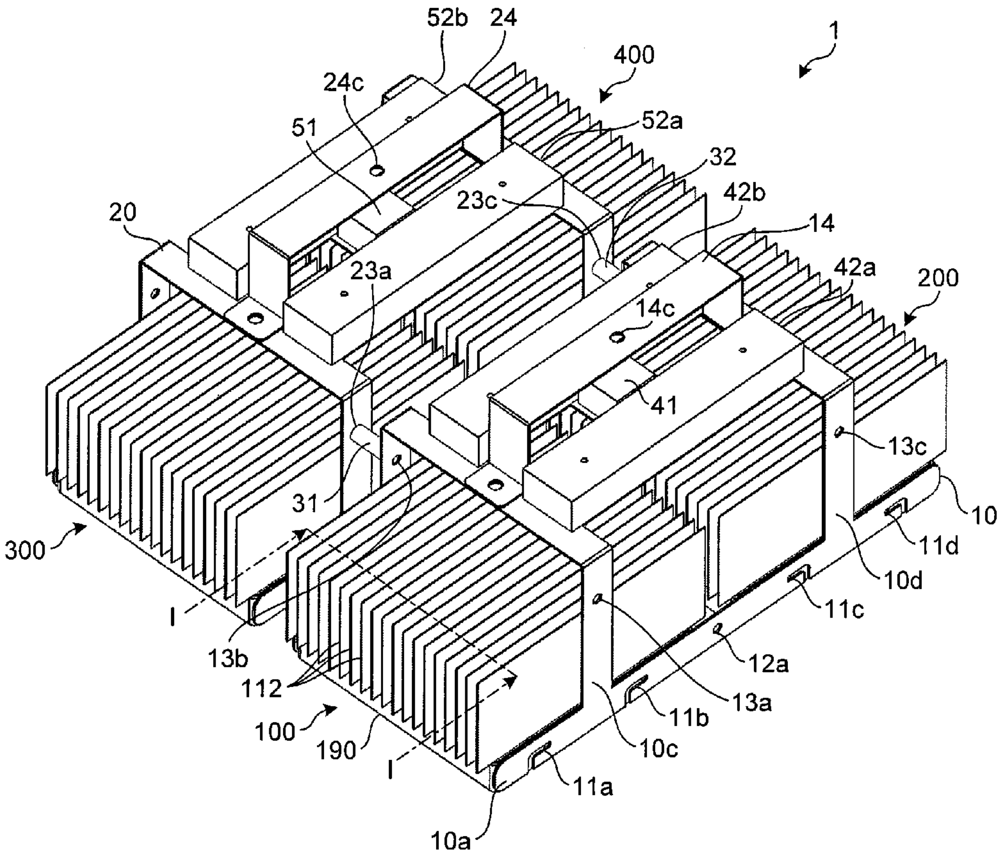
FIG. 1 is a perspective view illustrating an example of the external appearance of a lighting device according to a first embodiment.

Each of lighting units 100, 200, 300, and 400 according to exemplary embodiments to be discussed herein includes a board 120 which includes a light emitting elements 122 disposed on a first surface 120*a* (one surface 120*a*) of the board 120, a support member (fin base 111) having an interior surface 111*a* (a first surface 111*a*) on which a second surface 120*b* (a contact surface 120*b*) of the board 120 that is opposite to the first surface 120*a* is disposed to be in contact therewith to enable heat conduction from the board 120 to the support member, and a plurality of heat radiation fins 112 disposed on an exterior surface 111*b* (a second surface 111*b*) of the support member substantially parallel with each other and with a clearance between each other, and each having a flat shape that extends outwardly from the exterior surface 111*b*.

Each of the plural heat radiation fins 112 included in the respective lighting units 100, 200, 300, and 400 in the embodiments extends entirely across the exterior surface 111*b* and past ends of the exterior surface 111*b*. In other words, each of the plural heat radiation fins 112 included in the respective lighting units 100, 200, 300, and 400 in the embodiments have a projection 112P projecting from the edge of the exterior surface 111*b* to the outside.

Each of the plural heat radiation fins 112 included in the respective lighting units 100, 200, 300, and 400 in the embodiments are arranged in rows, each row having at least two heat radiation fins 112 with a gap therebetween, such that the heat radiation fins 112 of adjacent rows do not overlap with each other along an arrangement direction that is perpendicular to the rows direction.

Each gap is aligned with and sized to be substantially the same as the heat radiation fins in 112 adjacent rows.

One end of each of the heat radiation fins 112 is embedded in the exterior surface 111*b* and extends in a direction away from the exterior surface 111*b*.

Each of the lighting units 100, 200, 300, and 400 in the embodiments further includes metal bar-shaped components 115*a* through 115*d* which penetrate the respective surfaces of the heat radiation fins 112.

The bar-shaped component penetrates outer peripheries of the respective surfaces of the heat radiation fins 112.

The plural heat radiation fins 112 of the lighting units 100, 200, 300, and 400 in the embodiments are arranged on the exterior surface 111*b* at positions corresponding to and opposite positions of the light emitting elements 122 on the board 120.

A lighting device 1 according to exemplary embodiments to be discussed herein includes a plurality of the lighting units 100, 200, 300 and 400 each including the board 120 having the light emitting element 122 disposed thereon, the support member (fin base 111) having the interior surface 111*a* on which the board 120 is disposed to be in contact therewith to enable heat conduction from the board 120 to the support member, and a plurality of heat radiation fins 112 disposed on an exterior surface 111*b* of the support member substantially parallel with each other and with a clearance between each other, and each having a flat shape that extends outwardly from the exterior surface 111*b*, and a fixing frames 10 and 20 which fixes positions of the plural lighting units relative to each other such that the heat radiation fins 112 of the plural lighting units 100, 200, 300 and 400 do not contact each other. In other words, The lighting device 1 in the embodiments includes the lighting units 100, 200, 300, and 400, and the fixing frames 10 and 20 for fixing the plural lighting units 100, 200, 300, and 400 in such a condition that the heat radiation fins 112 of each of the plural lighting units 100, 200, 300, and 400 do not contact the heat radiation fins of the other lighting units.

The lighting unit and the lighting device in the embodiments are hereinafter described with reference to the accompanying drawings. Similar parts in the respective embodiments are given similar reference numbers, and the same explanation is not repeated.

First Embodiment

Figure 2:
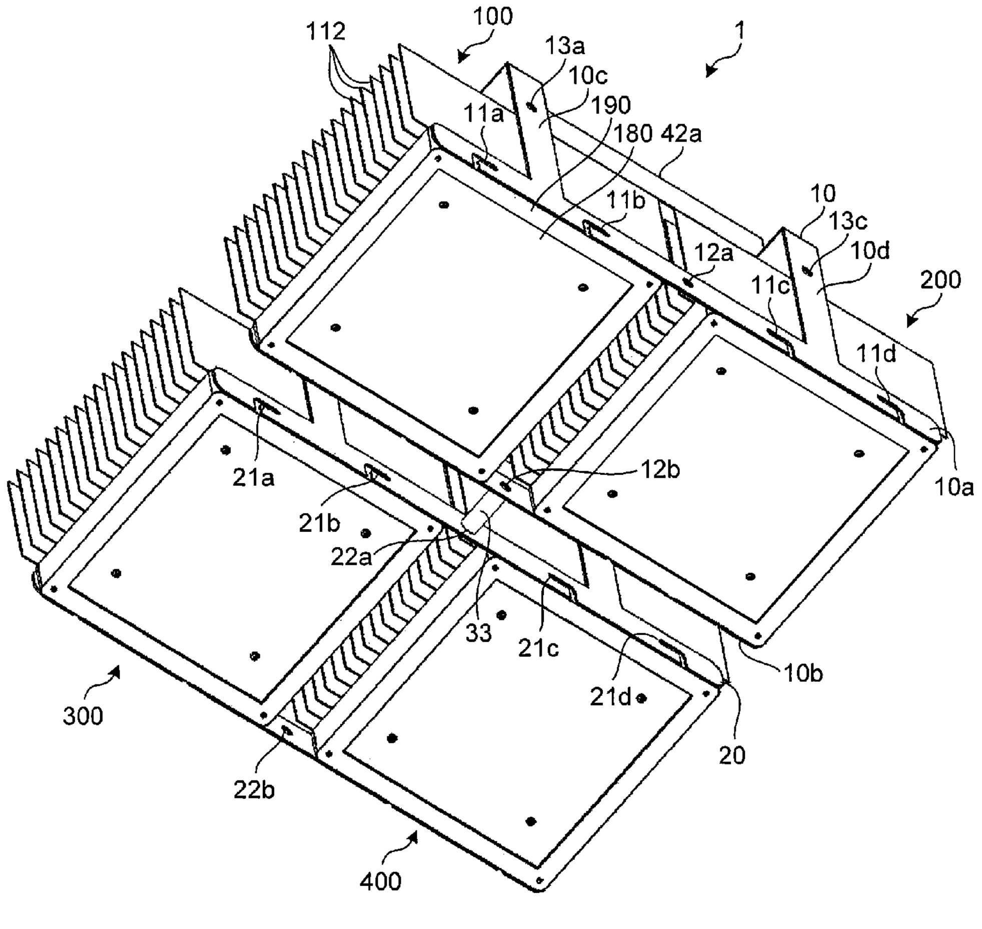
FIG. 2 is a perspective view illustrating the example of the external appearance of the lighting device.

FIGS. 1 and 2 are perspective views illustrating an example of the external appearance of the lighting device 1 according to a first embodiment. FIG. 1 shows the lighting device 1 as diagonally viewed from above, while FIG. 2 shows the lighting device 1 as diagonally viewed from below.

The lighting device 1 illustrated in FIGS. 1 and 2 is a device attached to a high ceiling of a building such as a gymnasium to illuminate a wide space below the lighting device 1 in FIGS. 1 and 2 through emission of light from light emitting elements such as LEDs mounted within the lighting device 1.

According to the example shown in FIGS. 1 and 2, the lighting device 1 includes the four lighting units 100, 200, 300, and 400. More specifically, the lighting units 100 and 200 are fixed to the fixing frame 10, while the lighting units 300 and 400 are fixed to the fixing frame 20. The fixing frames 10 and 20 are joined to each other to be assembled into the lighting device 1 provided with the four lighting units 100, 200, 300, and 400.

The respective components illustrated in FIGS. 1 and 2 are now more specifically explained. In the following description, the structure of the lighting unit 100 is chiefly discussed as a typical unit of the lighting units 100, 200, 300, and 400 having the same structure. Similarly, the structure of the fixing frame 10 is chiefly discussed as a typical frame of the fixing frames 10 and 20 having the same structure.

As illustrated in FIG. 2, the lighting unit 100 has a housing case 190. The housing case 190, which is made of metal having high heat conductivity, houses a transparent bottom cover 180, a board on which light emitting elements such as LEDs (described later) are mounted, and others.

As illustrated in FIGS. 1 and 2, the lighting unit 100 has a plurality of the heat radiation fins 112 standing above the housing case 190. The heat radiation fins 112 dissipate heat generated from the light emitting elements housed within the housing case 190 to the outside. In some of the figures referred to in the following description, only a part of the heat radiation fins are given the reference number "112". However, all the flat components standing above the housing case 190 correspond to the heat radiation fins 112.

The fixing frame 10 fixes the lighting units 100 and 200, and the fixing frame 20 fixes the lighting units 300 and 400. The fixing frames 10 and 20 are made of metal, for example. The fixing frame 10 and the fixing frame 20 are secured to each other via spacers 31 through 33. The details of the mechanism for securing the fixing frames 10 and 20 will be explained later.

As illustrated in FIG. 1, an attachment member 14, a terminal stand 41, and power source devices 42*a* and 42*b* are equipped on the fixing frame 10. The attachment member 14 is made of metal, for example, and attached to a ceiling or the like. The terminal stand 41 relays power supply from a not-shown commercial alternating current power source to the power source devices 42*a* and 42*b*. The power source devices 42*a* and 42*b* supply the power relayed from the terminal stand 41 to boards mounted within the lighting units 100 and 200 via not-shown power source lines. Similarly, an attachment member 24, a terminal stand 51, and power source devices 52*a* and 52*b* are equipped on the fixing frame 20. The lighting device 1 is attached to a ceiling or the like by connection between the ceiling and the attachment members 14 and 24.

Figure 3:
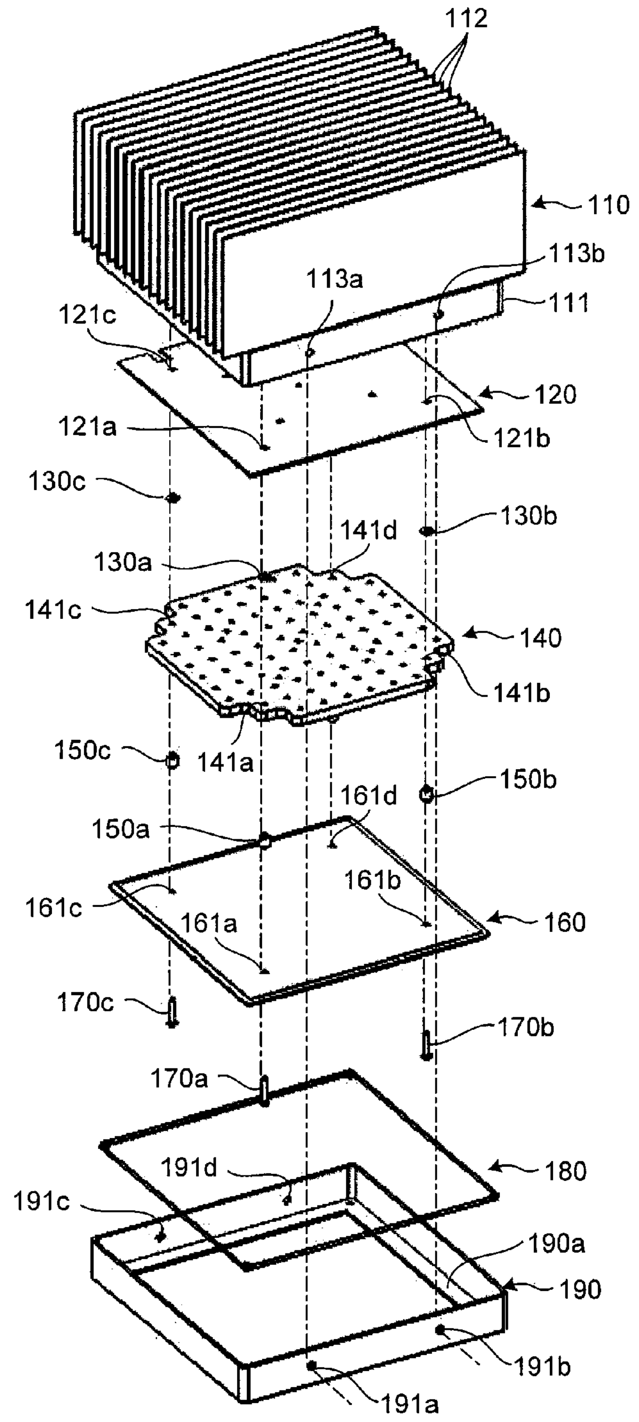
FIG. 3 is a perspective view illustrating a disassembled condition of a lighting unit according to the first embodiment.
Figure 4:
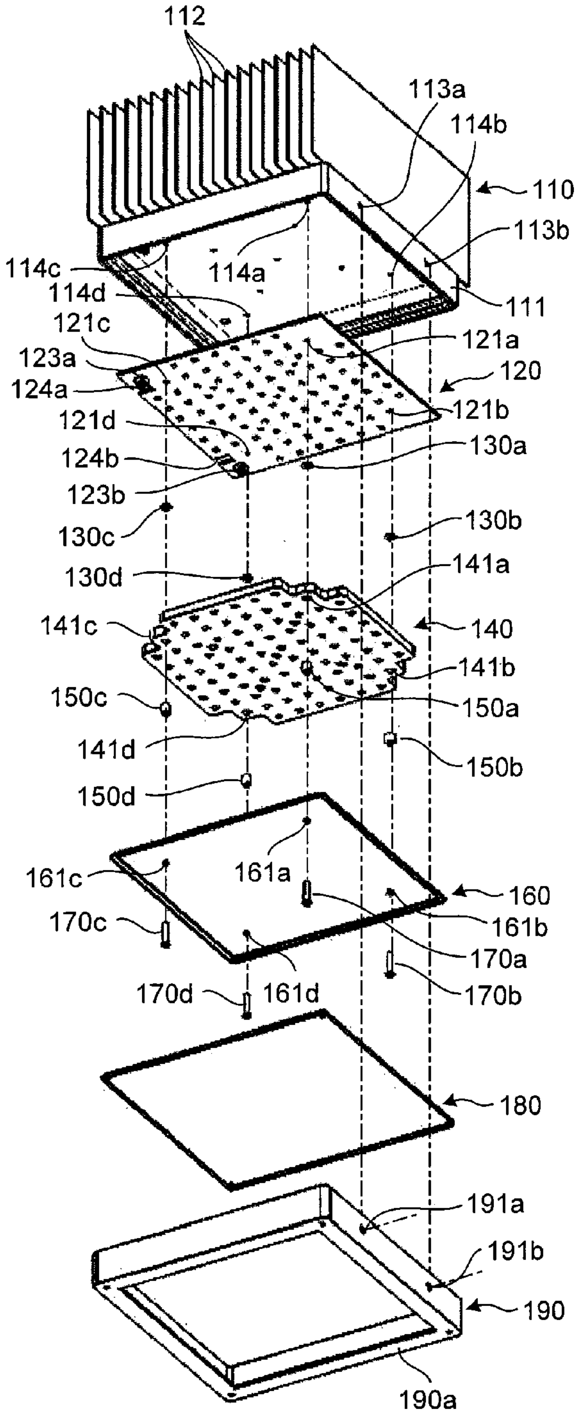
FIG. 4 is a perspective view illustrating a disassembled condition of the lighting unit.
Figure 5:
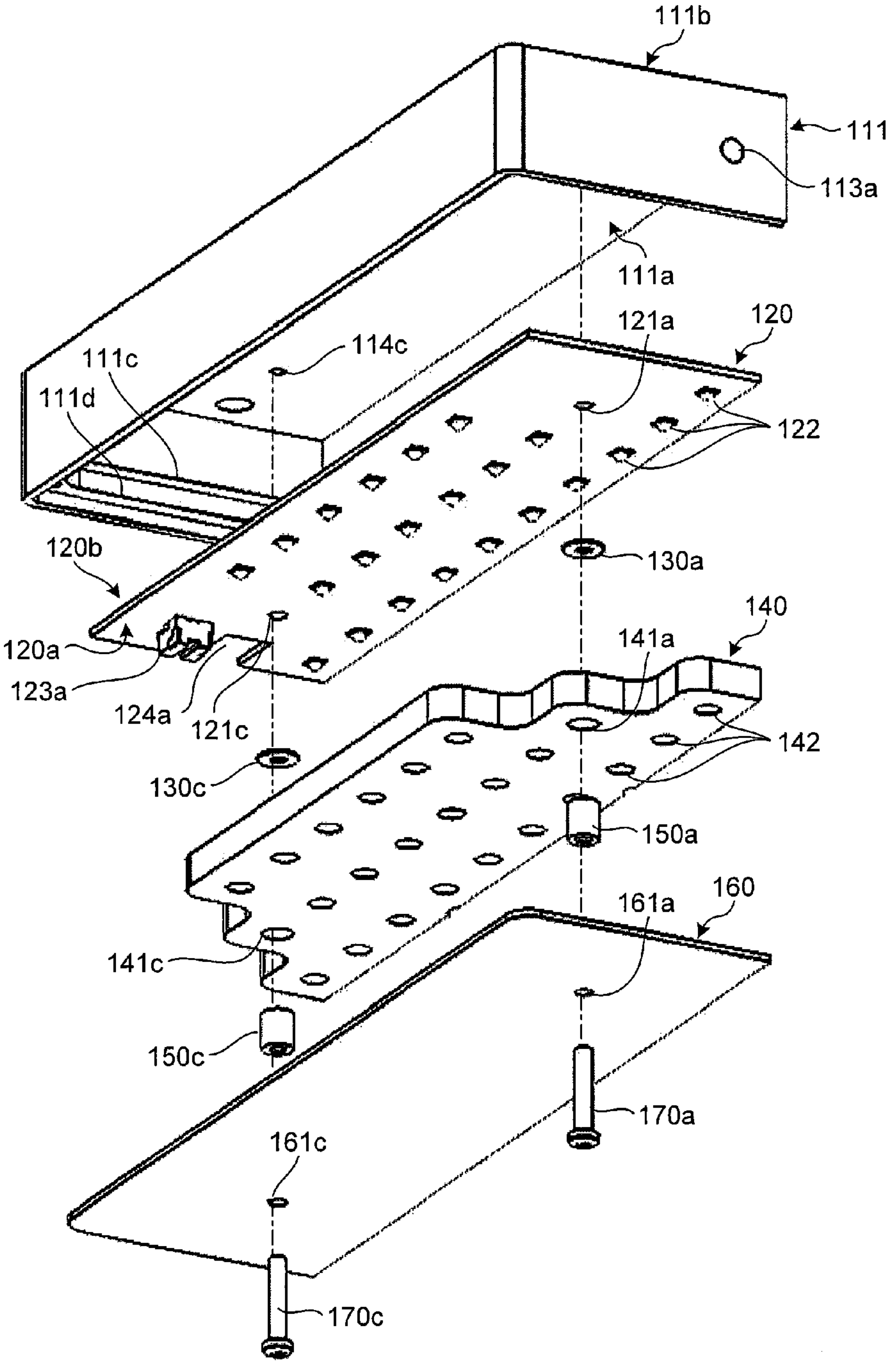
FIG. 5 is a perspective view illustrating a disassembled condition of the lighting unit.

An example of a disassembled condition of the lighting unit 100 according to the first embodiment is now explained. FIG. 3 through 5 are perspective views illustrating an example of a disassembled condition of the lighting unit 100 in the first embodiment. FIG. 3 shows an example of the lighting unit 100 as diagonally viewed from above. FIG. 4 shows an example of the lighting unit 100 as diagonally viewed from below. FIG. 5 illustrates an enlarged part of the lighting unit 100 shown in FIG. 4.

As illustrated in FIGS. 3 and 4, the lighting unit 100 in this embodiment includes a fin unit 110, the board 120, washers 130*a* through 130*d*, a reflector 140, spacers 150*a* through 150*d*, an optical lens 160, fixing screws 170*a* through 170*d*, the bottom cover 180, and the housing case 190.

The fin unit 110, which is made of metal having high heat conductivity, has the fin base 111 and the heat radiation fins 112. The fin base 111, functioning as a support member on which the board 120 is disposed, has the first surface 111*a* in tight face contact with the board 120, and the second surface 111*b* as the opposite side of the first surface 111*a* as illustrated in FIG. 5. The second surface 111*b* is a surface on which the heat radiation fins 112 stand.

The lower end of the fin base 111 has a substantially rectangular opening where the board 120, the reflector 140, the optical lens 160, and the bottom cover 180 are housed, with the first surface 111*a* forming the bottom of the opening. As illustrated in FIG. 5, the opening of the fin base 111 has two steps of a first step 111*c* and a second step 111*d* such that the opening area increases step by step in the direction from the first surface 111*a* toward the lower end of the opening.

As illustrated in FIGS. 3 and 4, screw holes 113*a* and 113*b*, into which not-shown fixing screws are threaded for fixation between the housing case 190 and the like and the fin base 111, are formed in the side surface of the outer wall of the fin base 111. Similarly, though not shown in the figures, not-shown screw holes similar to the screw holes 113*a* and 113*b* are formed in the side surface of the fin base ill on the side opposed to the side surface in which the screw holes 113*a* and 113*b* are formed. As illustrated in FIG. 4, screw holes 114*a* through 114*d*, into which the corresponding fixing screws 170*a* through 170*d* are threaded, are formed in the first surface 111*a* of the fin base 111.

The heat radiation fins 112 stand on the second surface 111*b* of the fin base 111 substantially in parallel with each other with a predetermined clearance left between each other. As noted above, the heat radiation fins 112 dissipate heat generated from the light emitting elements 122 mounted on the board 120 to the outside.

As illustrated in FIG. 5, the board 120 has a mounting surface 120*a* on which the light emitting elements 122 are mounted, and a contact surface 120*b* as the opposite side of the mounting surface 120*a*. The contact surface 120*b* is a surface brought into tight face contact with the first surface 111*a* of the fin base 111. As illustrated in FIG. 5, the plural light emitting elements 122 are mounted on the mounting surface 120*a*. In the respective figures referred to in the following description, a part of the light emitting elements are given the reference number "122". However, all the semi-spherical components mounted on the mounting surface 120*a* of the board 120 correspond to the light emitting elements 122. The board 120 is sized smaller than the opening area formed by the first step 111*c* so as to allow face contact between the contact surface 120*b* and the first surface 111*a* of the fin base 111.

As illustrated in FIG. 3 through 5, screw through holes 121*a* through 121*d*, through which the corresponding fixing screws 170*a* through 170*d* are inserted, are formed in the board 120. It is assumed that the board 120 in the first embodiment has SMD (surface mount device) structure where the plural light emitting elements 122 are mounted on the mounting surface 120*a*. However, instead of the SMD structure, the board 120 may have COB (chip on board) structure where the plural light emitting elements 122 are arranged and mounted on a part or the entire area of the mounting surface 120*a* in a fixed regular order such as a matrix form, a staggered form, and a radial form.

As illustrated in FIGS. 4 and 5, the board 120 has connectors 123*a* and 123*b* mounted on the mounting surface 120*a*, and notches 124*a* and 124*b* are formed in the board 120. The connectors 123*a* and 123*b* connect with one ends of the not-shown power source lines. The other ends of the power source lines pass through the notches 124*a* and 124*b* and connect with the power source devices 42*a* and 42*b*. This structure allows the board 120 to cause light emission from the light emitting elements 122 using the power supplied from the power source devices 42*a* and 42*b*.

During light emission, the light emitting elements 122 generate heat which possibly raises the temperatures of the light emitting elements 122. With extremely high temperatures of the light emitting elements 122, the performance of the light emission elements 122 may deteriorate. According to the lighting unit 100 in the first embodiment, the heat radiation fins 112 stand on the second surface 111*b* as the opposite side of the first surface 111*a* brought into close face contact with the board 120. In this case, in the lighting unit 100 according to the first embodiment, the heat generated from the light emitting elements 122 is conducted via the fin base 111 to the heat radiation fins 112 disposed on the opposite side of the light emitting elements 122. Therefore, the heat can be dissipated with high efficiency.

Each of the washers 130*a* through 130*d* is a flat washer inserted between the reflector 140 and the board 120, and a screw through hole, through which the corresponding one of the fixing screws 170*a* through 170*d* is inserted, is formed in the washers 130*a* through 130*d*.

The reflector 140, which is made of synthetic resin having light resistance, heat resistance, and electrical insulating characteristics, for example, controls distribution of light emitted from the light emitting elements 122 mounted on the board 120. More specifically, as illustrated in FIG. 5, as for the reflector 140, adjustors 142 which are through holes are formed at positions opposed to the light emitting elements 122. The hole shapes of the adjustors 142 control the distribution of the light emitted from the light emitting elements 122. In the respective figures to be referred to in the following description, only a part of the adjustors are given the reference number "142". However, all the holes formed in the reflector 140 at positions opposed to the light emitting elements 122 correspond to the adjustors 142.

As illustrated in FIG. 3 through 5, screw through holes 141*a* through 141*d*, through which the fixing screws 170*a* through 170*d* are inserted, are formed in the reflector 140. The reflector 140 is sized smaller than the opening area formed by the first step 111*c* of the fin base 111 so as to be mounted on the mounting surface 120*a* of the board 120.

The spacers 150*a* through 150*d* are positioning members capable of maintaining the reflector 140 and the optical lens 160 in such positions as to be away from each other with a predetermined clearance left therebetween. In the spacers 150*a* through 150*d*, screw through holes, through which the fixing screws 170*a* through 170*d* are inserted, are formed.

The optical lens 160 diverges or converges the light having the distribution direction adjusted by the adjustors 142 of the reflector 140. In the optical lens 160, screw through holes 161*a* through 161*d*, through which the fixing screws 170*a* through 170*d* are inserted for fixation between the optical lens 160 and the fin base 111, are formed. The optical lens 160 according to the first embodiment is sized larger than the opening area formed by the first step 111*c*, and smaller than the opening area formed by the second step 111*d*, so as to be mounted on the first step 111*c* of the fin base 111. The optical lens 160 in the first embodiment includes Fresnel lenses and fly-eye lenses, the details of which will be described later.

The fixing screws 170*a* through 170*d*, which are made of metal, for example, fix the optical lens 160, the reflector 140, and the board 120 to the fin base 111. For example, the fixing screw 170*a* is inserted through the screw through hole 161*a* of the optical lens 160, the spacer 150*a*, the screw through hole 141*a* of the reflector 140, the washer 130*a*, and the screw through hole 121*a* of the board 120 in this order to be threaded into the screw hole 114*a* formed in the first surface 111*a* of the fin base 111. Similarly, the fixing screws 170*b*, 170*c*, and 170*d* are threaded into the screw holes 114*b*, 114*c*, and 114*d* of the fin base 111, respectively.

The bottom cover 180 is a transparent flat plate made of polycarbonate, acrylic resin, or other materials, for example. The bottom cover 180 is sized larger than the opening area formed by the second step 111*d* and smaller than the opening area formed by the lower edge of the fin base 111 so as to be mounted on the second step 111*d* of the fin base 111. The bottom cover 180 has the function of reducing glare of the light so intense that direct view of the light emission surface from the outside is difficult, and further the function of preventing contact between a human body and the interior of the housing case 190 from the outside.

The housing case 190 is made of synthetic resin such as ABS resin, or metal such as aluminum die casting, and is opened to both above and below substantially in a rectangular shape. The lower end of the opening is provided with a projection 190*a* projecting from the edge of the lower end of the opening toward the inside. The housing case 190 having this structure houses the fin base 111 to which the board 120, the reflector 140, and the optical lens 160 are fixed, and the bottom cover 180. Screw through holes 191*a* through 191*d*, through which not-shown screws are inserted for fixation between the housing case 190 and the fixing frame 10, are formed in the housing case 190.

Figure 6:
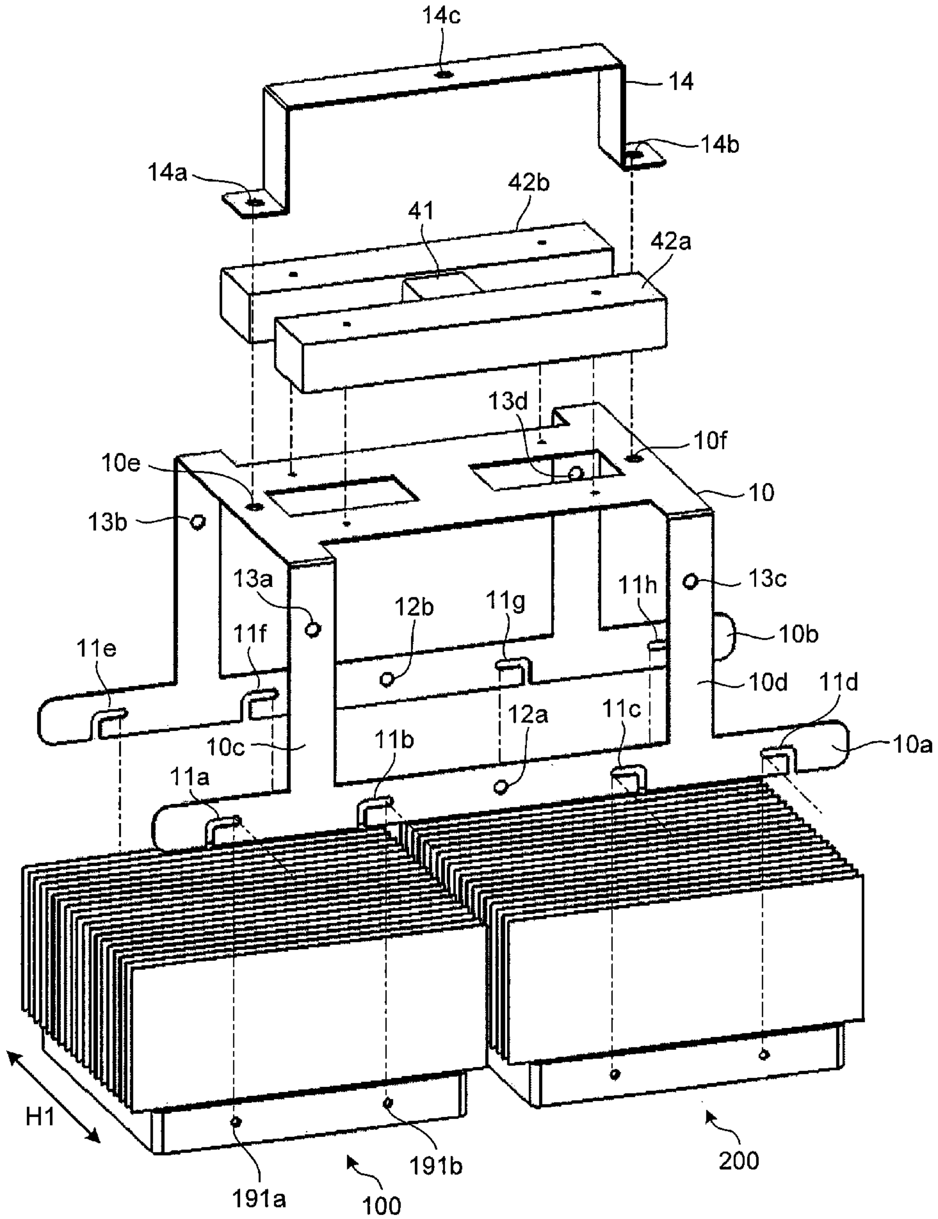
FIG. 6 is a perspective view illustrating an example of a disassembled condition of the lighting device.

An example of a disassembled condition of the lighting device 1 according to this embodiment is now explained. FIG. 6 is a perspective view illustrating an example of a disassembled condition of the lighting device 1 according to the first embodiment. FIG. 6 shows the lighting units 100 and 200 fixed to the fixing frame 10 as an example.

As illustrated in FIG. 6, the fixing frame 10 includes a pair of lower fixing portions 10*a* and 10*b*, and a pair of bridging portions 10*c* and 10*d*. The lower fixing portions 10*a* and 10*b* are flat components whose lengths in the lateral direction are substantially equivalent to the length of the housing case 190 in the height direction. The lower fixing portions 10*a* and 10*b* are positioned opposed to each other with a space left therebetween, which space is substantially equivalent to the length of the heat radiation fins 112 in an arrangement direction H1. The bridging portions 10*c* and 10*d* extend longer than the length of the heat radiation fins 112 in the height direction from the upper ends of the lower fixing portions 10*a* and 10*b*, and bridge the space between the lower fixing portions 10*a* and 10*b*.

Notches 11*a* through 11*d* are formed in the lower fixing portion 10*a* of the fixing frame 10. Similarly, notches 11*e* through 11*h* are formed in the lower fixing portion 10*b*. A not-shown fixing screw is inserted through the notch 11*a* and the screw through hole 191*a* of the housing case 190 and threaded into the screw hole 113*a* of the fin base 111. Similarly, a not-shown fixing screw is inserted through the notch 11*b* and the screw through hole 191*b* and threaded into the screw hole 113*b*. The lower fixing portion 10*b* has a similar structure. More specifically, not-shown fixing screws are threaded via the notches 11*e* and 11*f* into the screw holes formed in the side surface of the fin base 111. This structure allows fixation between the lighting unit 100 and the fixing frame 10. Similarly, the lighting unit 200 is secured to the fixing frame 10 by fixing screws tightened via the notches 11*c*, 11*d*, 11*g*, and 11*h*.

As illustrated in FIG. 6, the terminal stand 41, and the power source devices 42*a* and 42*b* are fixed to the upper surface of the fixing frame 10. The attachment member 14 is fixed to the fixing frame 10 by not-shown fixing screws inserted through screw through holes 14*a* and 14*b* formed in the attachment member 14 and threaded into screw holes 10*e* and 10*f* formed in the upper surface of the fixing frame 10.

The mechanism for junction between the fixing frame 10 and the fixing frame 20 is now explained. As illustrated in FIG. 6, a pair of screw through holes 12*a* and 12*b* is formed at the position facing each other of the lower fixing portions 10*a* and 10*b* of the fixing frame 10. Moreover, a pair of screw through holes 13*a* and 13*b* is formed at the position, which is extended portions of the bridging portion 10*c* from the lower fixing portions 10*a* and 10*b* in the upward direction, facing each other of the bridging portion 10*c*. Similarly, a pair of screw through holes 13*c* and 13*d* is formed at the position facing each other of the bridging portion 10*d*. As illustrated in FIGS. 1 and 2, the fixing frame 20 has screw through holes in the lower fixing portions and the bridging portions similarly to the fixing frame 10. For example, as illustrated in FIG. 1, screw through holes 23*a* and 23*c*, corresponding to the screw through holes 13*a* and 13*c* of the fixing frame 10, are formed in the fixing frame 20. Moreover, as illustrated in FIG. 2, a screw through hole 22*a*, corresponding to the screw through hole 12*a* of the fixing frame 10, is formed in the fixing frame 20, for example.

According to this structure, as illustrated in FIG. 1, the spacer 31 is inserted between the screw through hole 13*b* of the fixing frame 10 and the screw through hole 23*a* of the fixing frame 20. A not-shown fixing screw is inserted through the screw through hole 13*b* and threaded into the spacer 31, and a not-shown fixing screw is inserted through the screw through hole 23*a* and threaded into the spacer 31. Similarly, the spacer 32 is inserted between the screw through hole 13*d* of the fixing frame 10 and the screw through hole 23*c* of the fixing frame 20. A not-shown fixing screw is inserted through the screw through hole 13*d* and threaded into the spacer 32, and a not-shown fixing screw is inserted through the screw through hole 23*c* and threaded into the spacer 32. Furthermore, as illustrated in FIG. 2, the spacer 33 is inserted between the screw through hole 12*b* of the fixing frame 10 and the screw through hole 22*a* of the fixing frame 20. A not-shown fixing screw is inserted through the screw through hole 12*b* and threaded into the spacer 33, and a not-shown fixing screw is inserted through the screw through hole 22*a* and threaded into the spacer 33.

By junction between the fixing frame 10 and the fixing frame 20 in this manner, the large-scale lighting device 1 including the lighting units 100, 200, 300, and 400 is produced.

Figure 7:
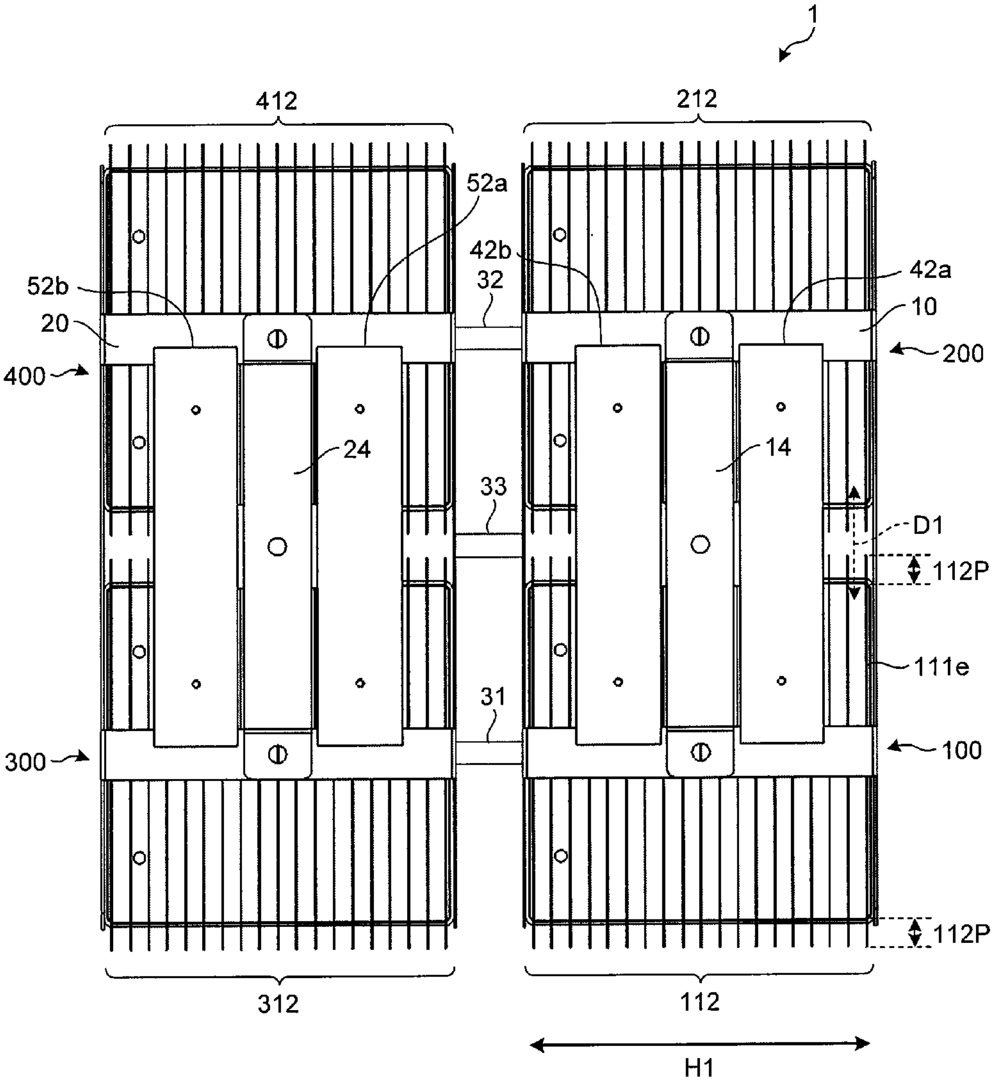
FIG. 7 is a top view of the lighting device.

An example of the external appearance of the lighting device 1 in the first embodiment as viewed from above is now explained. FIG. 7 is a top view of the lighting device 1 according to the first embodiment. As illustrated in FIG. 7, each of the plural heat radiation fins 112 of the lighting unit 100 has the projection 1122 projecting toward the outside from the edge of the second surface 111*b* of the fin base 111 (or the housing case 190). More specifically, each of the plural heat radiation fins 112 stands on the second surface 111*b* such that each side of the heat radiation fins 112 longer than a predetermined side 111*e* as the edge of the second surface 111*b* extends substantially parallel with the side 111*e*. Similarly, each of heat radiation fins 212 of the lighting unit 200, each of heat radiation fins 312 of the lighting unit 300, and each of heat radiation fins 412 of the lighting unit 400 have similar projections as those of the heat radiation fins 112.

As can be understood, each of the heat radiation fins 112, 212, 312, and 412 according to the first embodiment has a flat shape provided with the projection producing a large area. Thus, the contact area between the respective fins and the atmospheric air increases, wherefore the heat dissipation efficiency improves.

Moreover, as illustrated in FIG. 7, the lighting units 100, 200, 300, and 400 are fixed by the fixing frames 10 and 20 in such a condition that the heat radiation fins of each of the lighting units 100, 200, 300, and 400 do not contact the heat radiation fins of the other lighting units. More specifically, as illustrated in FIG. 7, the heat radiation fins 112 do not contact the heat radiation fins 212, and the heat radiation fins 312 do not contact the heat radiation fins 412. In other words, the notches 11*a* through 11*h* are formed in the fixing frame 10 for fixing the lighting units 100 and 200 in such a condition as to avoid contact between the heat radiation fins 112 and the heat radiation fins 212. Similarly, the notches are formed in the fixing frame 20 for fixing the lighting units 300 and 400 in such a condition as to avoid contact between the heat radiation fins 312 and the heat radiation fins 412.

According to the lighting device 1 in the first embodiment which includes the heat radiation fins 112, 212, 312, and 412 arranged in such a manner as to avoid contact between each other, no blockage is produced for the flow of air between the respective lighting units. Thus, the heat dissipation efficiency improves.

Furthermore, as illustrated in FIG. 7, the heat radiation fins 112 and 212 of the lighting units 100 and 200 are arranged in similar positions. In other words, the heat radiation fins 112 and 212 are located on the extension lines from each other. Similarly, the heat radiation fins 312 and 412 of the lighting units 300 and 400 are arranged in similar positions. In this case, the atmospheric air easily flows in a direction D1 indicated in FIG. 7 between the heat radiation fins 112 and 212, for example. Consequently, the heat dissipation effect of the heat radiation fins 112 and 212 improves without stay of high-temperature air.

Figure 8:
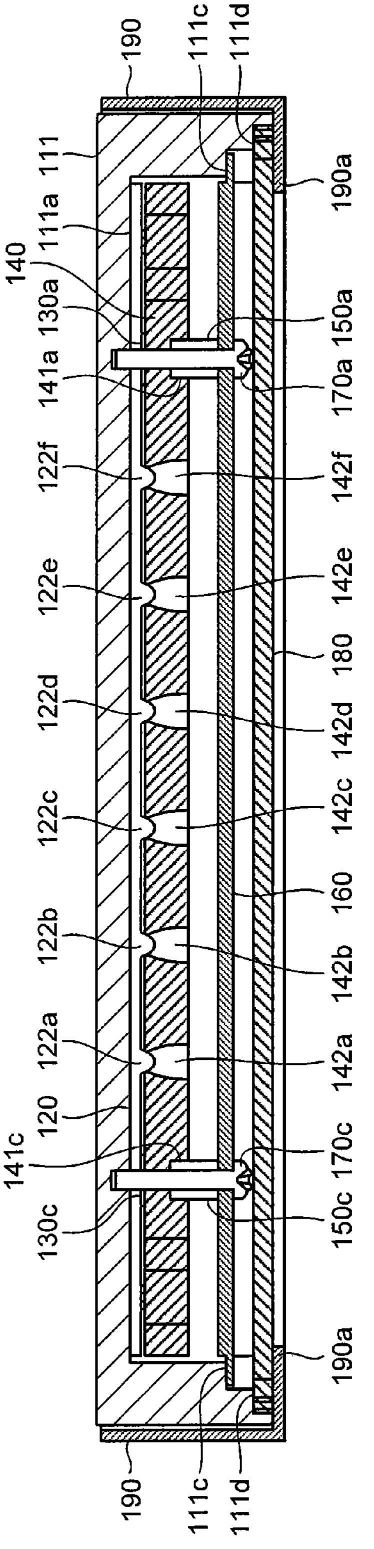
FIG. 8 is a cross-sectional view taken along a line I-I in FIG. 1.

A cross section of the lighting unit 100 in the first embodiment is now explained. FIG. 8 illustrates the cross section taken along a line I-I in FIG. 1. As can be seen from FIG. 8, the board 120 is brought into tight face contact with the first surface 111*a* of the fin base 111. In the example shown in FIG. 8, lighting elements 122*a* through 122*f* are mounted on the board 120. The reflector 140 is further laminated with the washers 130*a* and 130*c* interposed between the reflector 140 and the board 120. The reflector 140 has adjustors 142*a* through 142*f* at positions opposed to the light emitting elements 122*a* through 122*f*. The adjustors 142*a* through 142*f* are through holes whose diameters gradually increase in the direction from the light emitting elements 122 toward the optical lens 160.

The optical lens 160 is placed on the first step 111*c* of the fin base 111 with the spacers 150*a* and 150*c* inserted between the optical lens 160 and the reflector 140. The fixing screw 170*a* is inserted through the optical lens 160, the spacer 150*a*, the reflector 140, the washer 130*a*, and the board 120 in this order to be threaded into the first surface 111*a* of the fin base 111. Similarly, the fixing screw 170*c* is inserted through the optical lens 160, the spacer 150*c*, the reflector 140, the washer 130*c*, and the board 120 in this order to be threaded into the first surface 111*a* of the fin base 111. By this fixation, the board 120, the reflector 140, and the optical lens 160 are attached to the fin base 111.

According to the example shown in FIG. 8, a part of the spacers 150*a* and 150*c* are embedded in the screw through holes 141*a* and 141*c* of the reflector 140. Thus, the screw through hole 141*a* (and other) of the reflector 140 is so designed as to have a larger diameter than the outside diameter of the spacer 150*a* in the range between the end of the reflector 140 on the insertion side of the spacer 150*a* and the middle of the reflector 140 such that the spacer 150*a* can be embedded in the screw through hole 141*a*.

The bottom cover 180 is held between the second step 111*d* of the fin base 111 and the projection 190*a* of the housing case 190. Though not shown in the figures, the bottom cover 180 is fixed to the fin base 111 by a fixing screw inserted through the projection 190*a* and the bottom cover 180 in this order and threaded into the second step 111*d*.

According to this structure, the spacers 150*a* and 150*c* are inserted between the reflector 140 and the optical lens 160 so that the reflector 140 and the optical lens 160 can be positioned away from each other by a predetermined distance. In this case, the optical lens 160 of the lighting unit 100 in the first embodiment is not easily affected by the heat generated from the board 120. For divergence or convergence of light in a desired condition, the optical lens 160 needs to be disposed away from the light emitting elements 122 by a predetermined distance. In the case of the lighting unit 100 in the first embodiment, the distance between the reflector 140 and the optical lens 160 is determined by the spacers 150*a* and 150*c*, so that the optical lens 160 can diverge or converge light in a desired condition.

According to the example shown in FIG. 8 (and FIG. 5), the first step 111*c* and the second step 111*d* are formed in the fin base 111. However, these steps 111*c* and 111*d* are not mechanisms for positioning the optical lens 160 and the bottom cover 180, but only function as portions for temporarily positioning these components 160 and 180. The positional relationship between the reflector 140 and the optical lens 160 is determined only by the spacers 150*a* through 150*d*. Thus, the fin base 111 is not necessarily required to have such a stepped configuration produced by the first step 111*c* and the second step 111*d*.

According to the first embodiment, the spacers 150*a* through 150*d* determine the positions of the reflector 140 and the optical lens 160 such that the two components 140 and 160 are located away from each other by a predetermined distance. However, a positioning member which has a function similar to that of the spacers 150*a* through 150*d* may be formed integrally with the reflector 140 or with the optical lens 160. For example, the reflector 140 may have a convex corresponding to the positioning member extended from the lower surface of the reflector 140 toward the optical lens 160. Similarly, the optical lens 160 may have a convex corresponding to the positioning member extended from the upper surface of the optical lens 160 toward the reflector 140.

Figure 9:
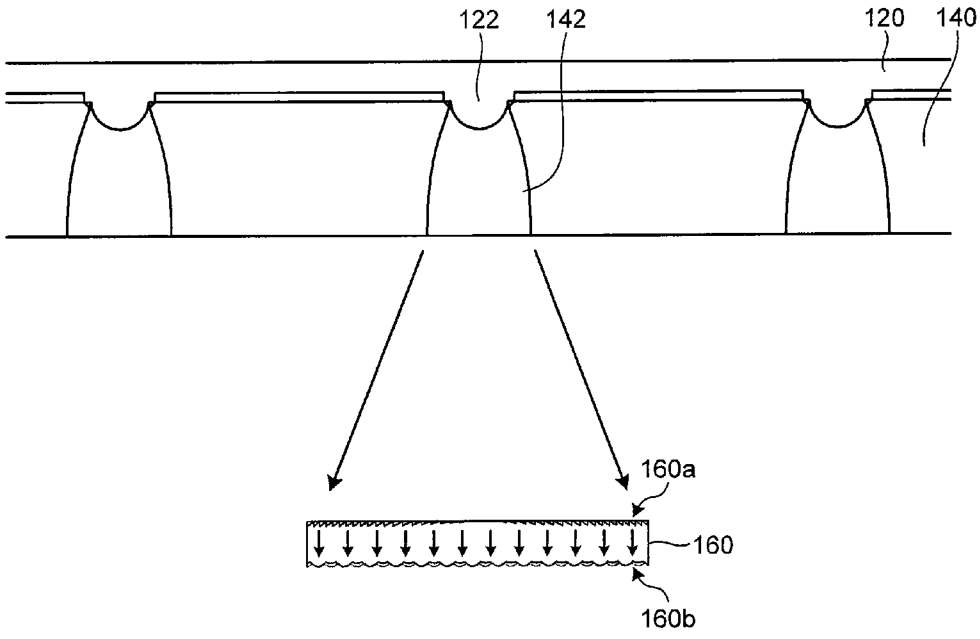
FIG. 9 schematically illustrates an enlarged cross section of an optical lens according to the first embodiment.
Figure 10:
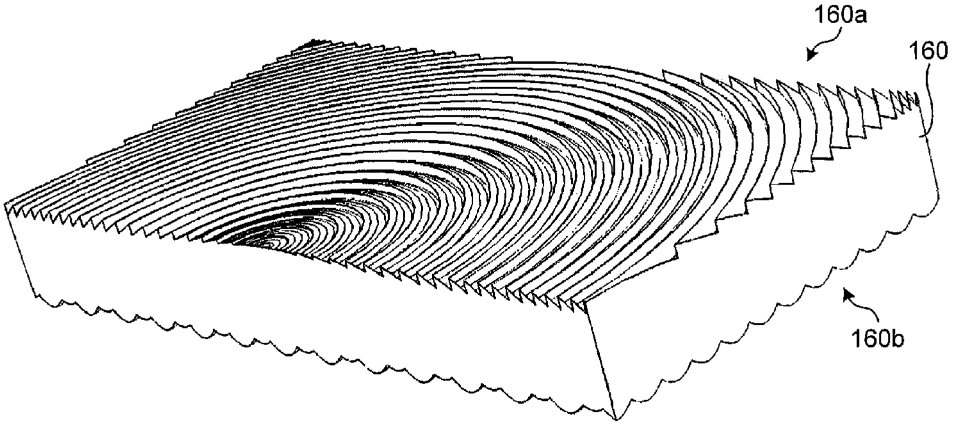
FIG. 10 illustrates an example of the external appearance of an enlarged cross section of the optical lens.

The optical lens 160 in the first embodiment is now explained. FIG. 9 schematically illustrates an enlarged cross section of the optical lens 160 according to the first embodiment. FIG. 10 illustrates an example of the external appearance of an enlarged cross section of the optical lens 160 according to the first embodiment. As illustrated in FIGS. 9 and 10, the optical lens 160 in the first embodiment has a Fresnel lens 160*a* at a position opposed to each of the light emitting elements 122 (adjustors 142), and a fly-eye lens 160*b* on the opposite side of the Fresnel lens 160*a*.

Each of the Fresnel lens 160*a* refracts light received from the corresponding light emitting element 122 after control of light distribution by the function of the adjustor 142 to convert the light into collimated light without decreasing the total amount of the light. More specifically, the Fresnel lens 160*a* refracts the light applied thereto from the adjustor 142 in a direction substantially perpendicular to the fly-eye lens 160*b* without attenuating the light. The fly-eye lens 160*b* diffuses the light refracted by the Fresnel lens 160*a* without attenuation to supply the light toward a not-shown area on the bottom cover 180 side.

The Fresnel lens 160*a* and the fly-eye lens 160*b* of the optical lens 160 shown at a position opposed to the one light emitting element 122 (adjustor 142) in FIG. 9 and illustrated in FIG. 10 as the external appearance of the optical lens 160 are provided opposed to all the light emitting elements 122 (adjustors 142).

As noted above, the optical lens 160 according to the first embodiment refracts the light emitted from the light emitting elements 122 by the function of the Fresnel lens 160*a* to convert the light into collimated light, thereby illuminating a room or the like without decreasing the total amount of the light. Moreover, the optical lens 160 diffuses the light by the function of the fly-eye lens 160*b*, thereby reducing glare of the light so intense that direct view from the outside is difficult. In this case, the optical lens 160 allows illumination of the room or the like without decreasing the total amount of the light emitted from the light emitting elements 122, and with reduction of the glare of the light. Accordingly, efficient use of the light emitted from the light emitting elements 122 for illumination of the room or the like can be realized.

As described above, in the lighting unit 100 according to the first embodiment, the contact surface 120*b* of the board 120 is disposed on the first surface 111*a* of the fin base 111, and the plural heat radiation fins 112 stand on the second surface 111*b* as the opposite side of the first surface 111*a*.

According to the lighting unit 100 in the first embodiment, therefore, the heat generated from the light emitting elements 122 mounted on the board 120 is efficiently conducted via the fin base 111 to the heat radiation fins 112 located on the opposite side of the light emitting elements 122. Thus, heat dissipation can be efficiently achieved.

Particularly, when the light emitting elements 122 are high-output elements such as LEDs, the temperatures of the light emitting elements 122 easily increase. Under this condition, there is a possibility that the heat generated from the light emitting elements 122 is not efficiently conducted to the heat radiation fins when the heat radiation fins stand on the housing main body or the reflector made of aluminum die casting or the like. For avoiding this problem, the configuration of the respective heat radiation fins is enlarged so that a sufficient heat dissipation effect can be produced. In this case, the size and weight of the lighting unit 100 increase. On the other hand, the lighting unit 100 in the first embodiment capable of efficiently dissipating the heat does not require scale magnification of the heat radiation fins 112 even when the high-output light emitting elements 122 are employed. Accordingly, reduction of the size and weight of the lighting unit 100 (lighting device 1) can be realized.

For expansion of the configuration of the heat radiation fins, increase in the height of the heat radiation fins is needed. In this case, unnecessary areas are required so as to increase the thickness of the roots of the heat radiation fins for draft angle cutting. However, according to the lighting unit 100 in the first embodiment, the heat radiation fins 112 stand on the fin base 111 without requiring enlargement of the scale of the heat radiation fins 112. Thus, no additional area for draft angle cutting is needed. Based on this point, reduction of the scale and weight of the lighting unit 100 (lighting device 1) is similarly achieved according to the first embodiment.

According to the lighting unit 100 in the first embodiment, each of the plural heat radiation fins 112 has the projection 112P projecting from the edge of the second surface 111*b* of the fin base 111 toward the outside. Thus, the heat dissipation effect improves.

According to the lighting unit 100 in the first embodiment, the spacers 150*a* through 150*d* as positioning members determine the position of the reflector 140 for controlling the reflection direction of the light emitted from the light emitting elements 122, and the position of the optical lens 160 for diverging or converging the light reflected by the reflector 140, such that the two components 140 and 160 can be located away from each other by the predetermined distance.

Therefore, the optical lens 160 of the lighting unit 100 in the first embodiment is not easily affected by the heat generated from the board 120, and allowed to diverge and converge the light in a desired condition.

According to the lighting device 1 in the first embodiment, the fixing frames 10 and 20 fix the respective lighting units 100, 200, 300, and 400 without contact between the heat radiation fins of each of the lighting units 100, 200, 300, and 400 and the heat radiation fins of the other lighting units. Therefore, the heat dissipation effect of the lighting device 1 in the first embodiment improves without blockage of the flow of air between the respective lighting units.

Second Embodiment

The lighting device 1, the lighting unit 100 and others according to the first embodiment may be modified in various ways. An example of the lighting device 1, the lighting units and others according to a second embodiment as modifications of the corresponding parts in the first embodiment is hereinafter described. In the following explanation, the lighting unit 100 is chiefly discussed similarly to the first embodiment. However, the mechanisms and the like discussed herein are applicable to the lighting units 200, 300, and 400 as well.

Figure 11:
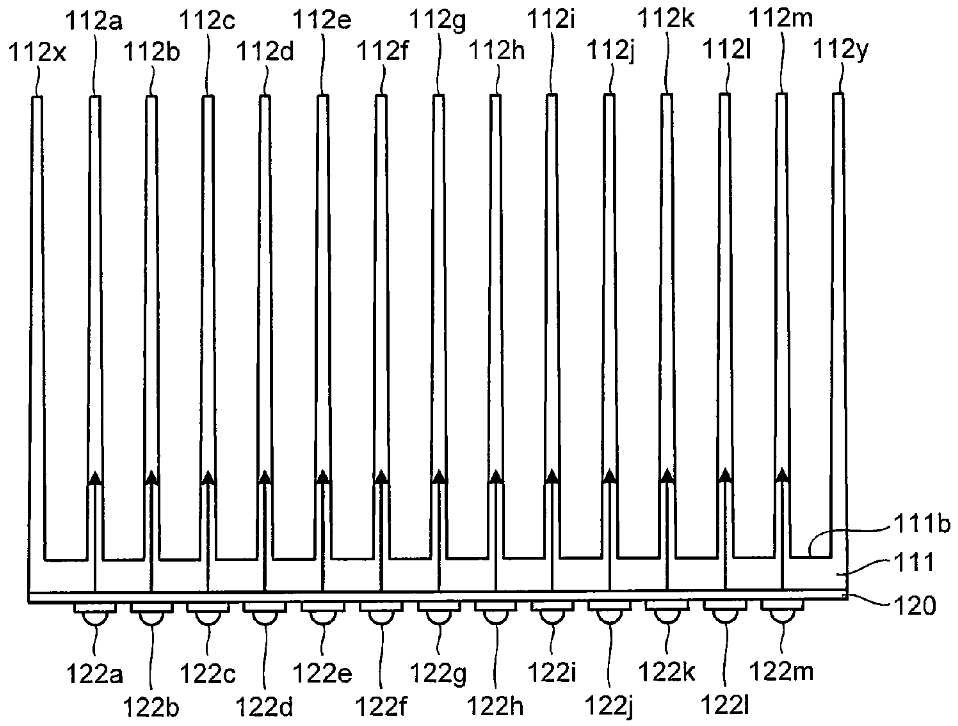
FIG. 11 schematically illustrates an enlarged cross section of heat radiation fins according to a second embodiment.

According to the first embodiment, the heat radiation fins 112 stand on the second surface 111*b* of the fin base 111. However, the standing positions of the heat radiation fins 112 on the second surface 111*b* may be determined in correspondence with the opposite positions of the light emitting elements 122 mounted on the board 120. This structure is now explained with reference to FIG. 11. FIG. 11 schematically illustrates an enlarged cross section of the heat radiation fins 112 according to the second embodiment.

In the example shown in FIG. 11, heat radiation fins 112*a* through 112*m* stand on the second surface 111*b* of the fin base 111 at the positions corresponding to the opposite side of light emitting elements 122*a* through 122*m* mounted on the board 120. When the respective heat radiation fins 112 are disposed just above the light emitting elements 122 as in the lighting unit 100 in this example, the heat generated from the light emitting elements 122 can be efficiently conducted to the heat radiation fins 112 as indicated by arrows in FIG. 11. Thus, the heat dissipation effect improves.

The standing positions of the heat radiation fins 112 are not limited to the positions shown in FIG. 11 but may be such positions not opposed to the light emitting elements 122. For example, heat radiation fins 112*x* and 112*y* may stand at positions not opposed to the light emitting elements 122 as illustrated in FIG. 11. Also, though not shown in FIG. 11, a heat radiation fin may be positioned between the heat radiation fin 112*a* and the heat radiation fin 112*b* in the example shown in FIG. 11.

Figure 12:
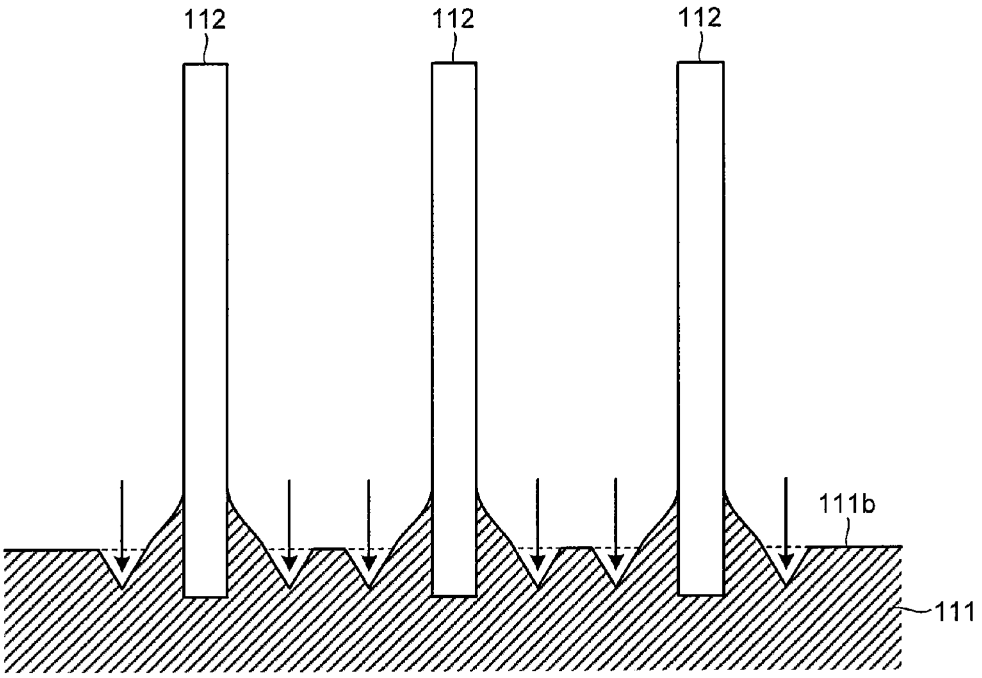
FIG. 12 schematically illustrates an enlarged cross section of the heat radiation fins.

The standing mechanism of the heat radiation fins 112 is now explained. FIG. 12 schematically illustrates an enlarged cross section of the heat radiation fins 112 according to the second embodiment. As illustrated in FIG. 12, one end of each of the heat radiation fins 112 is embedded in the second surface 111*b* of the fin base 111. The heat radiation fins 112 in this condition are pressed by using a stick for calking or the like in the direction indicated by arrows in FIG. 12 under contact bonding with the second surface 111*b* so as to be embedded in the fin base 111, for example. More specifically, raised areas from the second surface 111*b* are produced by the shift of the regions of the fin base 111 pressed by the stick or the like to other regions as illustrated in FIG. 12, so that one ends of the respective heat radiation fins 112 can be embedded in the raised areas of the fin base 111.

When the one ends of the heat radiation fins 112 are embedded in the fin base 111, the contact area between the heat radiation fins 112 and the fin base 111 increases. In this case, the heat generated from the light emitting elements 122 of the lighting unit 100 can be efficiently conducted from the fin base 111 to the respective heat radiation fins 112, wherefore the heat dissipation effect improves.

Figure 13:
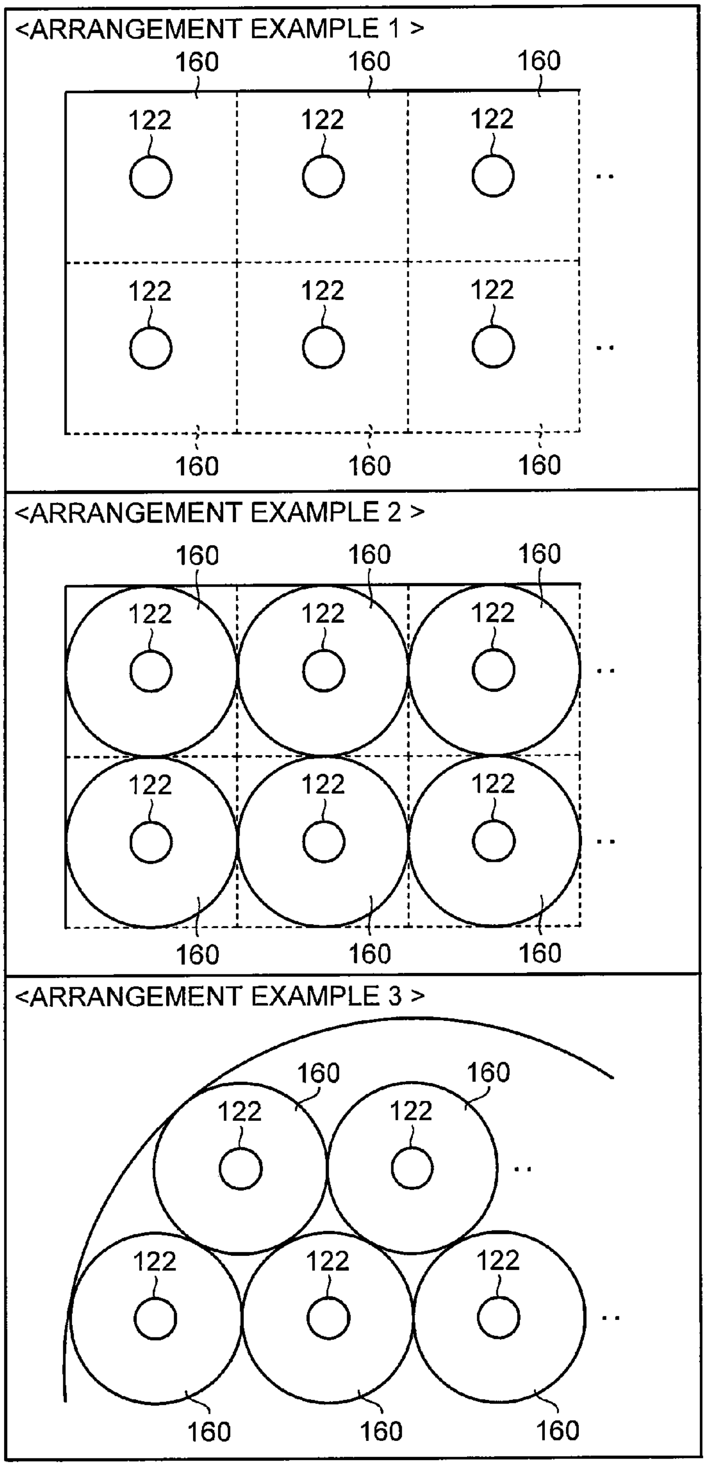
FIG. 13 illustrates arrangement patterns of an optical lens according to the second embodiment.

The arrangement pattern of the optical lens 160 according to the first embodiment shown in FIGS. 9 and 10 may be determined in various ways. These pattern variations are now explained with reference to FIG. 13. FIG. 13 illustrates the arrangement patterns of the optical lens 160 according to the second embodiment. FIG. 13 shows only the light emitting elements 122 and the optical lens 160 as viewed from above (in the direction from the light emitting elements 122 to the optical lens 160).

According to an example shown in <ARRANGEMENT EXAMPLE 1> in FIG. 13, rectangular pieces of the optical lens 160 shown in FIG. 10 are disposed at positions opposed to the respective light emitting elements 122. Alternatively, circular pieces of the optical lens 160 may be arranged at positions opposed to the respective light emitting elements 122 as in an example shown in <ARRANGEMENT EXAMPLE 2> in FIG. 13. When the board 120 and the like are circular, such a structure is allowed where the light emitting elements 122 are mounted on the circular board 120 in a grid pattern as illustrated in an example shown in <ARRANGEMENT EXAMPLE 3> in FIG. 13. In this case, circular pieces of the optical lens 160 may be disposed at positions opposed to the respective light emitting elements 122 as in the example shown in <ARRANGEMENT EXAMPLE 3> in FIG. 13.

Figure 14:
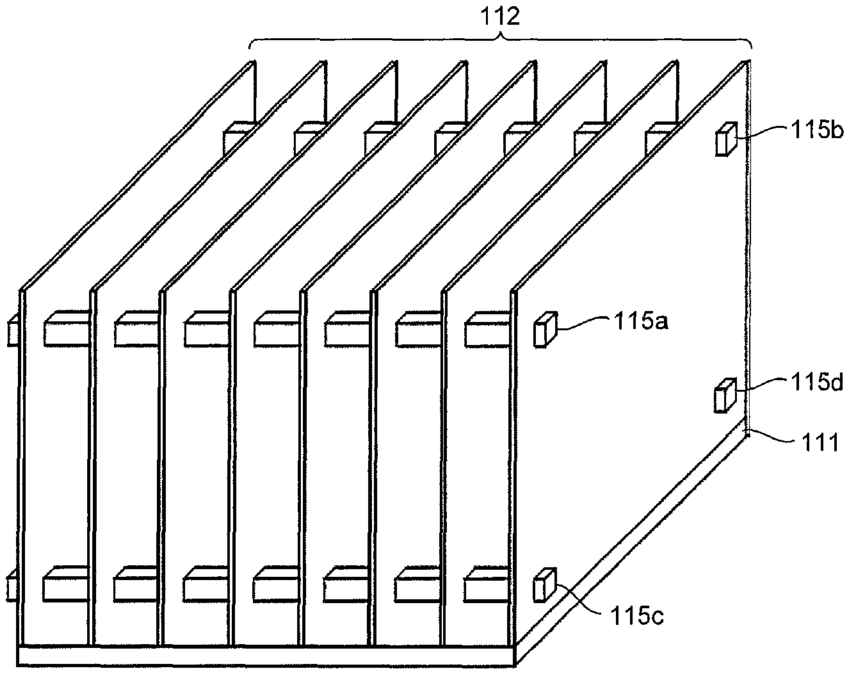
FIG. 14 illustrates bar-shaped components according to the second embodiment.
Figure 15:
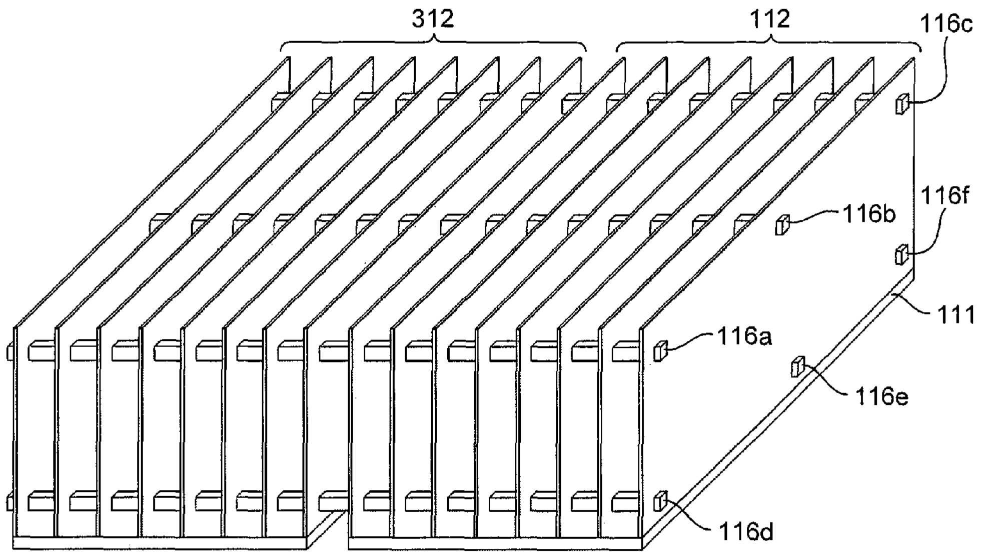
FIG. 15 illustrates bar-shaped components according to the second embodiment.

It can be understood that the heat radiation fins 112 employed in the first embodiment have flat shapes and therefore are easily bended or deformed into other shapes. For preventing this problem, the lighting unit 100 may have bar-shaped components penetrating the respective surfaces of the plural heat radiation fins. This structure is now explained with reference to FIGS. 14 and 15. FIGS. 14 and 15 illustrate examples of the bar-shaped components according to the second embodiment.

As illustrated in FIG. 14, the bar-shaped components 115*a* through 115*d*, which are made of metal having high heat conductivity or the like, penetrate the surfaces of the plural heat radiation fins 112 standing on the fin base 111. The bar-shaped components 115*a* through 115*d* provided in this manner combine the plural heat radiation fins 112 into one body. In this case, the plural heat radiation fins 112 can be reinforced for each for avoiding deformation. According to the example shown in FIG. 14, the bar-shaped components 115*a* through 115*d* penetrate the peripheries (four corners) of the surfaces of the plural heat radiation fins 112 so as not to block the flow of air.

According to an example shown in FIG. 15, penetrating-bar-shaped components 116*a* through 116*f* penetrate the surfaces of both the heat radiation fins 112 of the lighting unit 100 and the heat radiation fins 312 of the lighting unit 300. According to this structure, the penetrating-bar-shaped components 116*a* through 116*f* cross and combine the plural heat radiation fins of the different lighting units into one body for reinforcement. Thus, deformation of the plural heat radiation fins can be further prevented.

While FIGS. 14 and 15 show the heat radiation fins 112 and 312 not having the projections 112P projecting from the edges of both ends of the second surface 111*b* toward the outside, the heat radiation fins 112 and 312 shown in FIGS. 14 and 15 may have the projections 112P.

Figure 16:
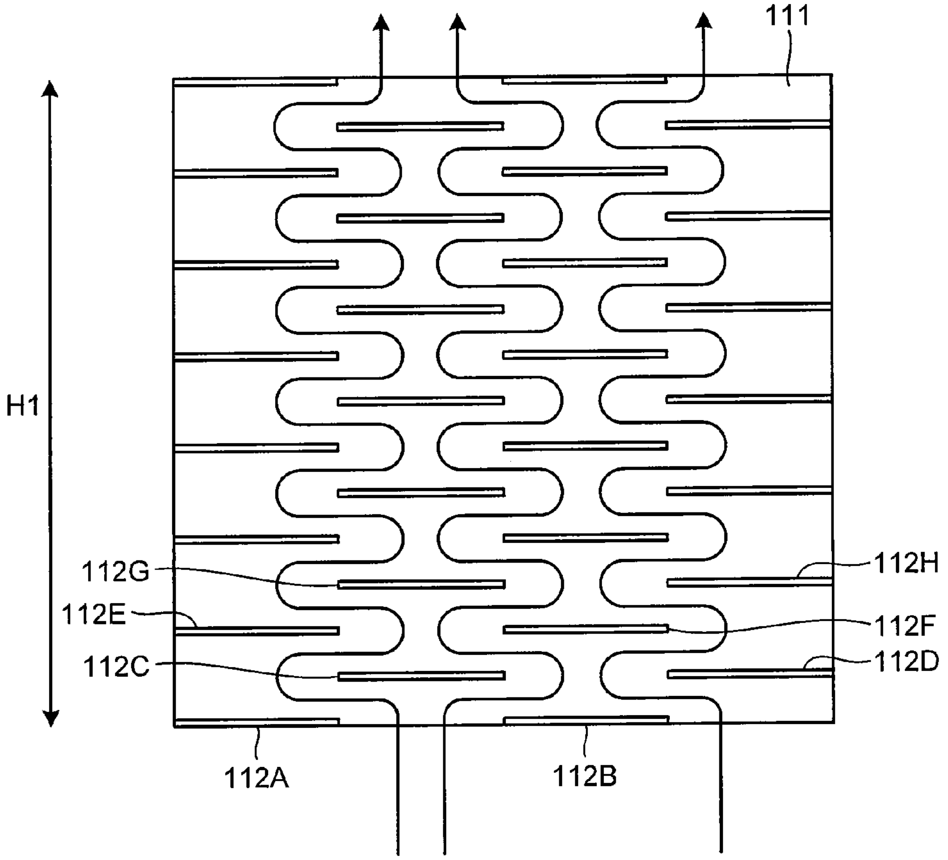
FIG. 16 illustrates an arrangement example of the heat radiation fins.

According to the first embodiment, the plural heat radiation fins 112 have the projections 112P projecting from the edges of both ends of the second surface 111*b* toward the outside, and are arranged on the fin base 111 with the predetermined space left between the respective heat radiation fins 112 as illustrated in FIG. 7. However, the configuration and arrangement of the heat radiation fins 112 are not limited to those shown in this example. This modification is now explained with reference to FIG. 16. FIG. 16 illustrates an arrangement example of the heat radiation fins 112 according to the second embodiment. FIG. 16 shows the heat radiation fins 112 as viewed from above.

As can be seen from FIG. 16, heat radiation fins 112A through 112H (and other heat radiation fins not designated by the reference number) corresponding to the plural heat radiation fins 112 stand on the fin base 111 in such a condition that at least a part of each of the heat radiation fins does not overlap with the adjoining heat radiation fin in the arrangement direction H1, or that the entire area of each of the heat radiation fins does not overlap with the adjoining heat radiation fin in the arrangement direction H1. More specifically, the heat radiation fin 112C is disposed adjacent to the heat radiation fins 112A, 112B, 112E, and 112F in the arrangement direction H1, but does not overlap with the heat radiation fins 112A, 112B, 112E, and 112F in the arrangement direction H1. Moreover, according to the example shown in FIG. 16, the pair of the heat radiation fins 112A and 112B, the pair of the heat radiation fins 112C and 112D, and others sequentially stand at such positions that the flat surfaces of the heat radiation fins become perpendicular to the arrangement direction H1. Also, the respective heat radiation fins 112 stand in such positions as to alternate with each other in the arrangement direction H1.

According to this structure, the air flowing substantially in the vertical direction with respect to the surfaces of the respective heat radiation fins reaches the inside of the respective heat radiation fins 112 as indicated by arrows in FIG. 16. Thus, efficient heat dissipation can be achieved. It should be noted that the lighting device 1 discussed in the foregoing examples is attached not only to the ceiling or the like for downward illumination but also to a wall of a room or the like for illumination in the horizontal direction. In this case, the gravitational force acts in the downward direction from above in the example illustrated in FIG. 16. Under this condition, air flows in the direction indicated by the arrows in FIG. 16 due to the characteristics of air which easily rises as the temperature of air increases. According to the heat radiation fins 112 arranged as in FIG. 16, the efficiency of heat dissipation improves.

The arrangement pattern of the heat radiation fins 112 is not limited to the example shown in FIG. 16 but may be other patterns. For example, such an arrangement is allowed in which the one heat radiation fin 112 (for example, a heat radiation fin equivalent to the heat radiation fins 112A and 112B connected with each other) stands at such a position in which the flat surface of this heat radiation fin becomes perpendicular to the arrangement direction H1. Alternatively, only the heat radiation fins 112A, 112C, 112F, and 112H arranged stepwise in FIG. 16, for example, may be provided.

Figure 17:
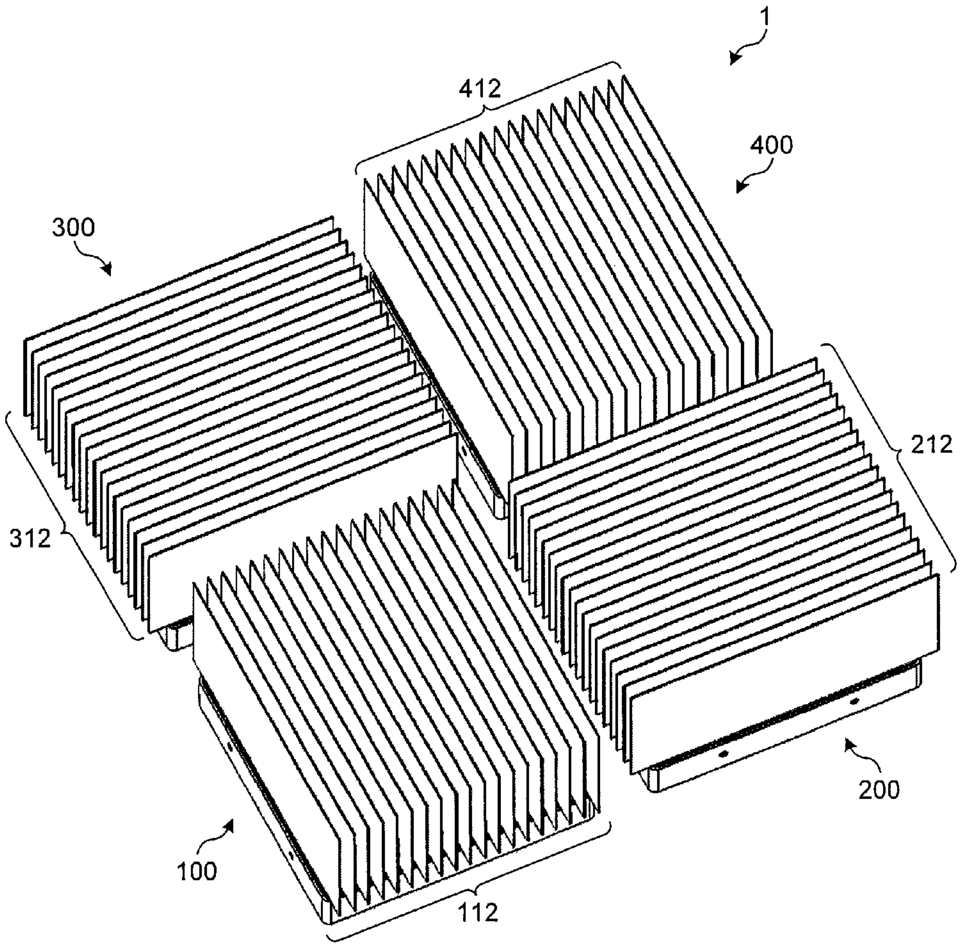
FIG. 17 illustrates the directions of lighting units according to the second embodiment.

According to the lighting device 1 in the first embodiment, the respective arrangement directions of the heat radiation fins of the lighting units 100, 200, 300, and 400 are equalized. However, these arrangement directions may be determined otherwise. The modified arrangement directions are now explained with reference to FIG. 17. FIG. 17 illustrates the directions of the respective lighting units according to the second embodiment.

In the case of the example shown in FIG. 17, the arrangement direction of the heat radiation fins of each of the lighting units 100, 200, 300, and 400 is different from the adjoining lighting units. For example, the fixing frame 10 fixes the lighting units 100 and 200 such that the arrangement direction of the heat radiation fins 112 becomes a first direction, and that the arrangement direction of the heat radiation fins 212 becomes a second direction substantially perpendicular to the first direction. On the other hand, the fixing frame 20 fixes the lighting units 300 and 400 such that the arrangement direction of the heat radiation fins 312 becomes the second direction, and that the arrangement direction of the heat radiation fins 412 becomes the first direction. According to this structure, the lighting device 1 contains the lighting units 100, 200, 300, and 400 which have the heat radiation fins standing in the arrangement directions shown in FIG. 17.

According to the lighting device 1 shown in FIG. 17, flow of air is blocked between the heat radiation fins of each of the lighting units and the heat radiation fins of the adjoining lighting unit. Thus, heat conduction between the lighting units is avoided. In this case, heat dissipation effects are independently provided by the lighting units for each in the lighting device 1 shown in FIG. 17. Accordingly, the heats generated from the respective lighting units can be equalized.

Figure 18:
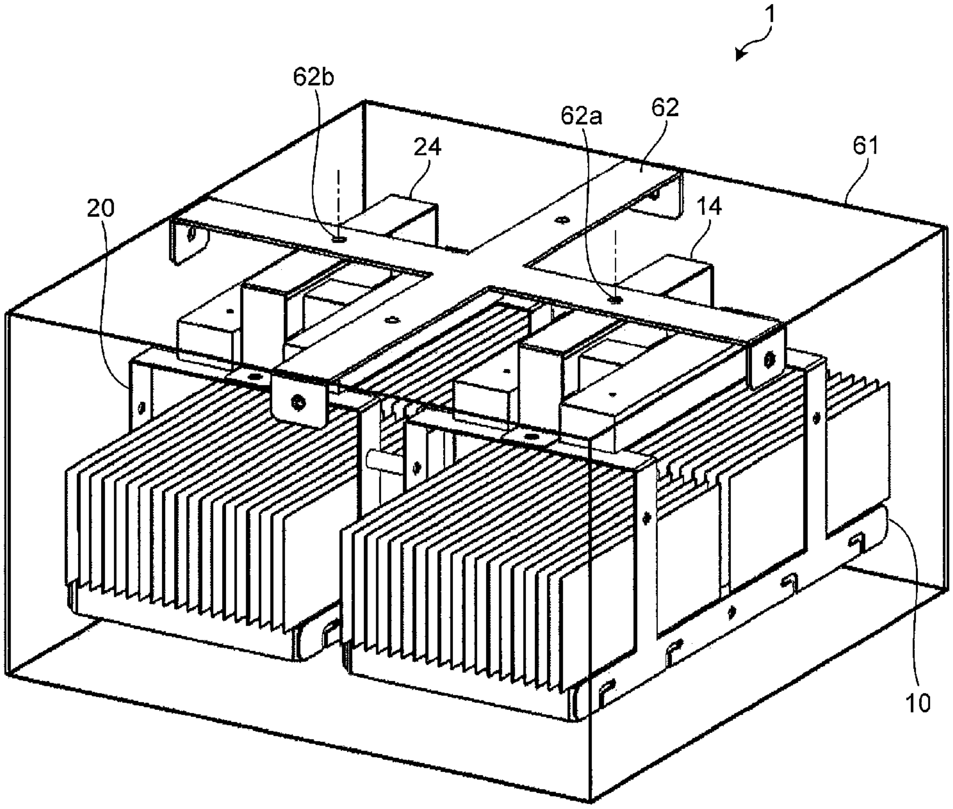
FIG. 18 illustrates components attached to the lighting device according to the second embodiment.
Figure 19:
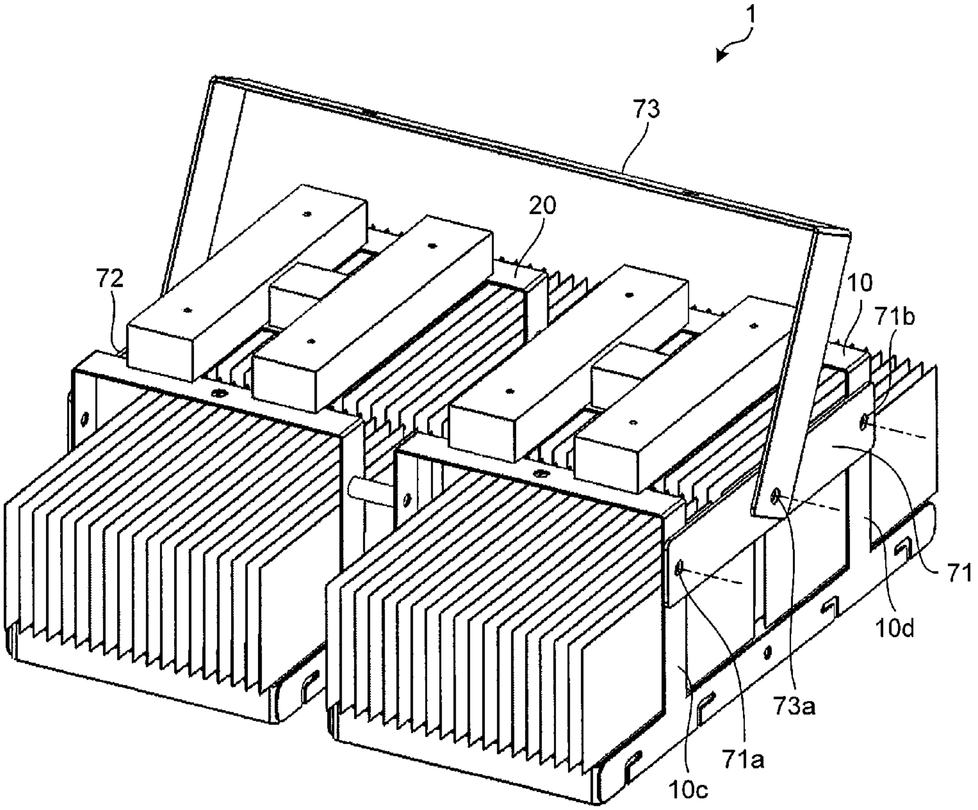
FIG. 19 illustrates components attached to the lighting device according to the second embodiment.
Figure 20:
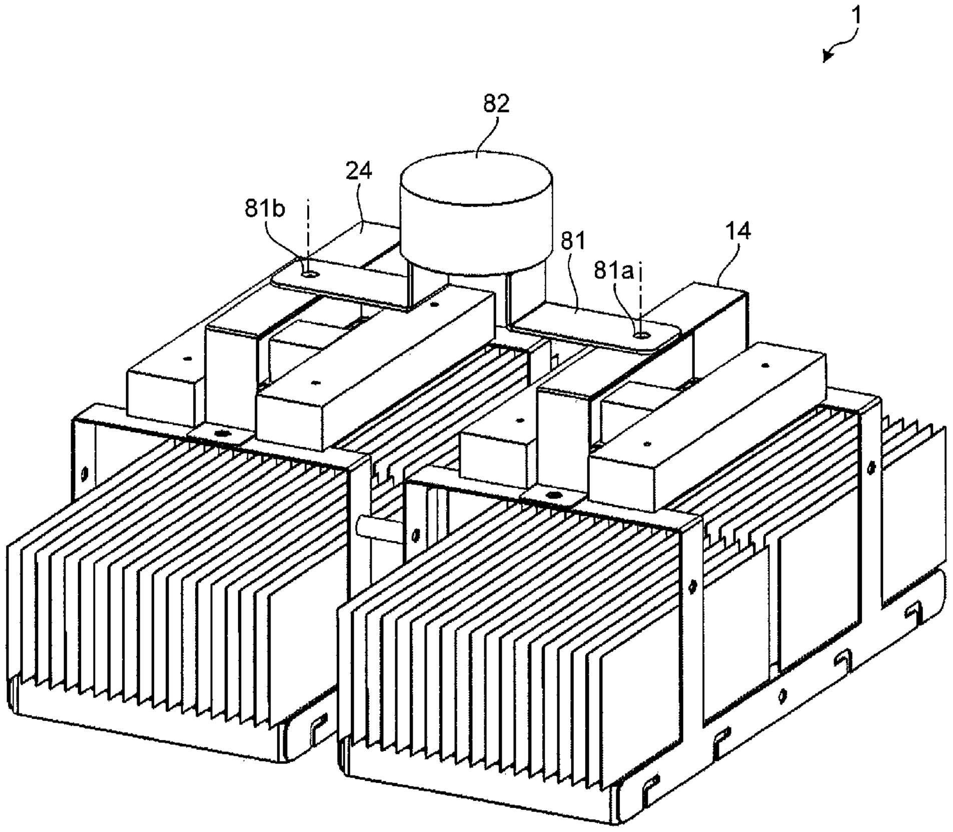
FIG. 20 illustrates components attached to the lighting device according to the second embodiment.

The lighting device 1 according to the first embodiment is attached to a high ceiling of a gymnasium or the like in many cases. Thus, the lighting device 1 may be equipped with various components necessary for installation on a high ceiling. The lighting device 1 including these components is now explained with reference to FIG. 18 through 20. FIG. 18 through 20 illustrate components attached to the lighting device 1 in the second embodiment.

According to an example shown in FIG. 18, the lighting device 1 includes a guard member 61 and an attachment member 62. The guard member 61 is made of transparent material, for example, and covers the entire area of the lighting device 1 to prevent contact between a thing (such as a ball) used in the gymnasium or the like and the lighting units. For example, the upper surface of the guard member 61 is attached to the attachment members 14 and 24 by a fixing screw inserted from above through a screw through hole 62*a* of the attachment member 62 and threaded into a screw hole 14*c* (see FIG. 1) formed in the attachment member 14, and a fixing screw inserted from above through a screw hole 62*b* of the attachment member 62 and threaded into a screw hole 24*c* (see FIG. 1) formed in the attachment member 24, with the upper surface of the guard member 61 sandwiched between the attachment member 62 and the fixing frames 10 and 20.

According to an example shown in FIG. 19, the lighting device 1 includes attachment members 71 and 72, and an inclined arm 73. The attachment member 71 has screw through holes 71*a* and 71*b*. The attachment member 71 is fixed to the bridging portion 10*c* of the fixing frame 10 by a fixing screw inserted through the screw through hole 71*a* and threaded into the screw through hole 13*a* (see FIG. 1) formed in the bridging portion 10*c* of the fixing frame 10, and a fixing screw inserted through the screw through hole 71*b* and threaded into the screw through hole 13*c* (see FIG. 1) formed in the bridging portion 10*d*. Similarly, the attachment member 72 is attached to the bridging portions of the fixing frame 20 as illustrated in FIG. 19.

The inclined arm 73 provided for varying the illumination angle of the lighting device 1 is rotatably attached to the attachment portion 71 joined to the fixing frame 10 and the attachment member 72 joined to the fixing frame 20 as illustrated in FIG. 19. More specifically, the inclined arm 73 extends from the center of the flat shape of the inclined arm 73 toward both ends thereof by a predetermined length, and is bended on both sides in the same direction substantially at right angles. Screw through holes 73*a* are further formed at both ends of the bended portions of the inclined arm 73. The screw through hole 73*a* at one end of the inclined arm 73 is rotatably attached to the attachment member 71, while the screw hole 73*a* at the other end is rotatably attached to the attachment member 72.

According to an example shown in FIG. 20, the lighting device 1 includes an attachment member 81, and an elevating device 82. In the attachment member 81, screw through holes 81*a* and 81*b* are formed. The attachment member 81 is attached to the attachment members 14 and 24 by a fixing screw inserted from above through the screw through hole 81*a* of the attachment member 81 and threaded into the screw hole 14*c* (see FIG. 1) formed in the attachment member 14, and a fixing screw inserted from above through the screw through hole 81*b* of the attachment member 81 and threaded into the screw hole 24*c* (see FIG. 1) formed in the attachment member 24. The elevating device 82 as a device capable of raising and lowering the lighting device 1 is attached to the upper surface of the attachment member 81. The elevating device 82 has a suspension cable, a winding drum around which the suspension cable is wound and from which the suspension cable is drawn, a motor for rotating the winding drum, and others.

The guard member 61, the inclined arm 73, and the elevating device 82 shown in FIG. 18 through 20 are attached to the lighting device 1 via anchor bolts or the like. It is preferable that the number or the diameter of the anchor bolts increases as the weight of the lighting device rises for sufficient earthquake-proof characteristics and the like. In other words, the number of the anchor bolts increases as the lighting device becomes heavier. However, according to the lighting device 1 shown in FIG. 18 through 20 which is made lightweight as noted above, increase in the number and the diameter of the anchor bolts can be avoided. For example, in the case of the example shown in FIG. 18, the guard member 61 can be attached to the lighting device 1 by using only two anchor bolts inserted through the screw through holes 62*a* and 62*b*.

The lighting device 1 installed on a high ceiling as in the above examples is applicable to a surface-mounting type lighting device attached to places other than a high ceiling.

The respective components fixed to the lighting device 1 via the fixing screws as in the above examples may be fixed via other fixing members such as pins instead of the fixing screws.

The configurations and materials of the respective parts in the foregoing embodiments are not limited to those described and depicted therein. For example, the fin unit 110, the board 120, the reflector 140, the optical lens 160, the bottom cover 180, and the housing case 190 may be circular components instead of rectangular components.

Accordingly, improvement over the heat dissipation effect can be achieved according to the respective embodiments.

Although certain embodiments of the invention have been described in the foregoing description, it is intended that the scope of the invention is not limited to the embodiments disclosed as only examples but is susceptible to numerous modifications and variations. Therefore, various eliminations, replacements, and changes may be made without departing from the scope and spirit of the invention. The respective embodiments and modifications included in the scope and spirit of the invention are also included in the scope of the invention claimed in the appended claims and the equivalents thereof.

What is claimed is:

1. A lighting unit, comprising:

a board which includes a light emitting element disposed on a first surface of the board;

a support member having an interior surface with which a second surface of the board that is opposite to the first surface is in contact;

a plurality of heat radiation fins disposed on an exterior surface of the support member substantially parallel with each other and with a clearance between each other, each of the heat radiation fins having a flat planar surface that extends outwardly from the exterior surface; and a fixing frame configured to be arranged outside of the heat radiation fins and having an inner surface that is substantially parallel to the flat planar surfaces of the heat radiation fins, wherein each of the plurality of heat radiation fins extends entirely across the exterior surface and past ends of the exterior surface.

2. The unit according to claim 1, wherein the plural heat radiation fins are arranged in rows, each row having at least two heat radiation fins with a gap therebetween, such that the heat radiation fins of adjacent rows do not overlap with each other along an arrangement direction that is perpendicular to the rows direction.

3. The unit according to claim 2, wherein each gap is aligned with and sized to be substantially the same as the heat radiation fins in adjacent rows.

4. The unit according to claim 1, wherein one end of each of the heat radiation fins is embedded in the exterior surface and extends in a direction away from the exterior surface.

5. The unit according to claim 1, further comprising a bar-shaped component made of metal and penetrating the respective flat planar surfaces of the heat radiation fins.

6. The unit according to claim 1, wherein the board includes a plurality of light emitting elements on the first surface of the board, and the heat radiation fins are arranged on the exterior surface at positions corresponding to and opposite to the light emitting element on the board.

7. The unit according to claim 1, wherein the support member is made of heat conductive metal.

8. A lighting device, comprising:

a plurality of the lighting units each including a board having a light emitting element disposed thereon, a support member having an interior surface with which the board is in contact, and a plurality of heat radiation fins disposed on an exterior surface of the support member substantially parallel with each other and with a clearance between each other, each of the heat radiation fins having a flat planar surface that extends outwardly from the exterior surface; and a fixing frame, which fixes positions of the plural lighting units relative to each other, such that the heat radiation fins of the plural lighting units do not contact each other, the fixing frame being arranged outside of the plurality of heat radiation fins and having an inner surface that is substantially parallel to the flat planar surfaces of the heat radiation fins of at least one of the lighting units, wherein the parallel direction of the heat radiation fins of each of the lighting units differs from that of the heat radiation fins of an adjacent lighting unit.

9. The device according to claim 8, wherein the different directions are perpendicular to each other.

10. The device according to claim 8, further comprising a penetrating-bar-shaped component made of metal and penetrating the respective flat planar surfaces of the heat radiation fins of the lighting units.

11. The device according to claim 8, further comprising a transparent guard member which covers all of the lighting units.

12. The device according to claim 8, further comprising an inclined arm rotatably attached to the fixing frame for varying illumination angles of the lighting units.

13. The device according to claim 8, further comprising an elevating device for raising and lowering the lighting device relative to an attachment position.

* * * * *